US012689185B2

(12) United States Patent
Takahashi et al.

(10) Patent No.: US 12,689,185 B2
(45) Date of Patent: Jul. 21, 2026

(54) LASER MODULE

(71) Applicant: HAMAMATSU PHOTONICS K.K., Hamamatsu (JP)

(72) Inventors: Hisanari Takahashi, Hamamatsu (JP); Kazuue Fujita, Hamamatsu (JP); Shohei Hayashi, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 543 days.

(21) Appl. No.: 18/115,844

(22) Filed: Mar. 1, 2023

(65) Prior Publication Data

US 2023/0361536 A1 Nov. 9, 2023

(30) Foreign Application Priority Data

Mar. 29, 2022 (JP) ................................. 2022-053451

(51) Int. Cl.
*H01S 5/34* (2006.01)
*H01S 5/02* (2006.01)
(Continued)

(52) U.S. Cl.
CPC ............ *H01S 5/3402* (2013.01); *H01S 5/021* (2013.01); *H01S 5/02253* (2021.01);
(Continued)

(58) Field of Classification Search
CPC ...... H01S 5/3401; H01S 5/509; H01S 5/0425; H01S 5/3402
See application file for complete search history.

(56) References Cited

U.S. PATENT DOCUMENTS

2016/0308331 A1 10/2016 Belkin et al.
2019/0074664 A1* 3/2019 Ito ........................... H01S 5/028
(Continued)

FOREIGN PATENT DOCUMENTS

CN 114788102 A 7/2022
JP 2001-264831 A 9/2001
(Continued)

OTHER PUBLICATIONS

Marchetti et al., "Coupling Strategies for Silicon Photonics Integrated Chips", Jan. 31, 2019, vol. 7, No. 2 (Year: 2019).*
(Continued)

*Primary Examiner* — Helal A Algahaim
*Assistant Examiner* — Benjamin D Wigger
(74) *Attorney, Agent, or Firm* — Faegre Drinker Biddle & Reath LLP

(57) ABSTRACT

The laser module includes a QCL element and a light source. The QCL element includes a substrate, a lower clad layer provided on the substrate, an active layer that is provided on an opposite side of the lower clad layer from the substrate and generates a first terahertz wave, an upper clad layer provided on an opposite side of the active layer from the lower clad layer, and a first electrode provided on an opposite side of the upper clad layer from the active layer. The second terahertz wave from the light source enters the active layer through the substrate, is reflected by the first electrode, and is amplified or wavelength-converted. The third terahertz wave amplified or wavelength-converted in the active layer is emitted to the outside through the substrate.

20 Claims, 7 Drawing Sheets

(51) Int. Cl.

| | |
|---|---|
| *H01S 5/02253* | (2021.01) |
| *H01S 5/04* | (2006.01) |
| *H01S 5/042* | (2006.01) |
| *H01S 5/50* | (2006.01) |

(52) U.S. Cl.

CPC ............ *H01S 5/041* (2013.01); *H01S 5/0425* (2013.01); *H01S 5/3401* (2013.01); *H01S 5/509* (2013.01); *H01S 2302/02* (2013.01)

(56) References Cited

U.S. PATENT DOCUMENTS

| | | | |
|---|---|---|---|
| 2021/0226411 A1* | 7/2021 | Miura | ..................... H01S 3/225 |
| 2023/0023686 A1* | 1/2023 | Leisher | ................. H01S 5/0424 |
| 2023/0318255 A1* | 10/2023 | Hayashi | .............. H01S 5/02253 |
| | | | 372/44.01 |

FOREIGN PATENT DOCUMENTS

| | | | |
|---|---|---|---|
| JP | 2010-521815 | A | 6/2010 |
| JP | 2018-041758 | A | 3/2018 |
| JP | 2021-099399 | A | 7/2021 |
| JP | 2021-099400 | A | 7/2021 |
| WO | 2008/143737 | A2 | 11/2008 |
| WO | 2021/125240 | A1 | 6/2021 |

OTHER PUBLICATIONS

Bachmann, Dominic et al., "Broadband terahertz amplification in a heterogeneous quantum cascade laser," Optics Express, Feb. 2015, vol. 23, No. 3, pp. 3117-3125.

* cited by examiner

LASER MODULE

TECHNICAL FIELD

The present disclosure relates to a laser module.

CROSS-REFERENCE TO RELATED APPLICATION

This application claims the benefit of priority from Japanese Patent Application No. 2022-053451, filed on Mar. 29, 2022, the entire contents of which are incorporated herein by reference.

BACKGROUND

Conventionally, a difference frequency generation type terahertz quantum cascade laser (DFG-THz-QCL: Difference Frequency Generation THz-Quantum Cascade Laser) has been known. For example, non-patent document 1 (Dominic Bachmann, Norbert Leder, Markus Rosch, Giacomo Scalari, Mattias Beck, Holger Arthaber, Jerome Faist, Karl Unterrainer, and Juraj Darmo, "Broadband terahertz amplification in a heterogeneous quantum cascade laser", February 2015, Vol. 23, No. 3, OPTICS EXPRESS, pp. 3117-3125) discloses a method of amplifying a terahertz wave by causing the terahertz wave (pulse wave) to be incident on an end surface of an active layer of the terahertz quantum cascade laser.

SUMMARY

However, since a thickness of the active layer is usually only about several μm to several tens of μm, it is not easy to cause a sufficient amount of terahertz wave to be incident on the end surface of the active layer. In addition, when the terahertz wave is incident on the end surface of the active layer along a resonance direction (a direction in which the pair of end surfaces of the active layer face each other), the absorption amount of the terahertz wave in the active layer becomes relatively large, and the efficiency of amplification (or wavelength conversion) of the terahertz wave is suppressed to be low.

Accordingly, it is an object of an aspect of the present disclosure to provide a laser module capable of improving efficiency of amplification or wavelength conversion of a terahertz wave.

A laser module according to an aspect of the present disclosure includes: a quantum cascade laser element configured to generate a first terahertz wave having a difference frequency between a first frequency and a second frequency; and a light source configured to emit a second terahertz wave that is different from the first terahertz wave to the quantum cascade laser element. The quantum cascade laser element includes: a substrate; a first clad layer provided on the substrate; an active layer that is provided on an opposite side of the first clad layer from the substrate, constitutes a resonator that oscillates a light of the first frequency and a light of the second frequency, and generates the first terahertz wave; a second clad layer provided on an opposite side of the active layer from the first clad layer; and a metal electrode provided on an opposite side of the second clad layer from the active layer. The second terahertz wave enters the active layer through the substrate, is reflected by the metal electrode, and is amplified or wavelength-converted. A third terahertz wave, which is the second terahertz wave after being amplified or wavelength-converted in the active layer, is emitted to the outside through the substrate.

According to the laser module, a second terahertz wave emitted from a light source may be amplified or wavelength-converted using a quantum cascade laser element that generates a terahertz wave (first terahertz wave) by generating a difference frequency. In the laser module, the second terahertz wave emitted from the light source is incident on the substrate instead of the end surface of the active layer. In other words, the second terahertz wave enters the active layer (that is, the surface of the active layer facing the substrate) via the inside of the substrate. According to this method, compared to a method in which the second terahertz wave is incident on the end surface of the active layer, the second terahertz wave can be easily incident on the active layer, and absorption of the second terahertz wave by the active layer can be suppressed. In addition, by reflecting the second terahertz wave by the metal electrode located on the opposite side of the active layer from the substrate, the second terahertz wave (i.e., the third terahertz wave) amplified or wavelength-converted in the active layer can be easily extracted to the outside via the substrate again. As described above, according to the laser module, it is possible to improve efficiency of amplification or wavelength conversion of a terahertz wave.

The substrate may be formed of InP or Si. According to the above configuration, since the substrate is formed of a material (InP or Si) having a small absorption coefficient for the terahertz wave, loss (attenuation) of the terahertz wave passing through the substrate can be suppressed, and the light amount of the third terahertz wave extracted to the outside can be improved.

A length of the active layer in a first direction which is a resonance direction of the quantum cascade laser element may be 100 μm to 3 mm. According to the above configuration, it is possible to suitably realize a configuration in which the third terahertz wave can be extracted to the outside by reflecting the second terahertz wave once by the metal electrode. That is, it is possible to prevent the second terahertz wave from being multiply reflected in the quantum cascade laser element. Accordingly, it is possible to reduce the loss of the second terahertz wave in the quantum cascade laser element due to the multiple reflection can be reduced, and as a result, the light amount of the third terahertz wave can be improved.

The substrate may be formed of Si. The substrate may include: a first main surface facing the first clad layer; and a second main surface located on an opposite side of the first main surface. After the second terahertz wave is first reflected by the metal electrode and before the second terahertz wave is emitted to the outside as the third terahertz wave, the second terahertz wave may be reflected by the second main surface of the substrate at least once or more and re-enters the active layer. According to the above-described configuration, since the second terahertz wave can be incident on the active layer a plurality of times by causing the second terahertz wave to undergo multiple reflection in the quantum cascade laser element, the efficiency of amplification or wavelength-conversion can be effectively improved by increasing the number of times of amplification or wavelength-conversion of the second terahertz wave. When the second terahertz wave is multiply reflected in the quantum cascade laser element, the loss of the second terahertz wave in the quantum cascade laser element becomes larger than when the second terahertz wave is not multiply reflected. However, by forming the substrate with Si, it is possible to effectively suppress the loss of the second terahertz wave (absorption into the substrate). That is, according to the above-described configuration, it is possible to obtain a merit of multiple reflection (improvement in efficiency of amplification or wavelength conversion of the second terahertz wave) while suppressing a demerit of multiple reflection (loss of the second terahertz wave).

The substrate may include: a first end surface located on a first side in a first direction which is a resonance direction of the quantum cascade laser element; and a second end surface located on a second side opposite to the first side in the first direction. The active layer may include: a third end surface located on the first side in the first direction; and a fourth end surface located on the second side in the first direction. The second terahertz wave may be incident on the first end surface along a direction inclined with respect to the first direction so as to approach the active layer from the first side toward the second side in the first direction. According to the above configuration, the second terahertz wave can be made incident from the first end surface of the substrate and reliably guided to the active layer, and can be reliably reflected by the metal electrode and extracted to the outside.

The third terahertz wave may be emitted from the second end surface along a direction inclined with respect to the first direction so as to move away from the active layer from the first side toward the second side in the first direction. According to the above configuration, since it is possible to extract the output light (third terahertz wave) from the second end surface opposite to the first end surface which is an incident surface of the second terahertz wave, it is possible to easily avoid interference between the light source which outputs the second terahertz wave and the member which captures the third terahertz wave, and it is possible to improve design flexibility regarding arrangement of each member.

The substrate may include: a first main surface facing the first clad layer; and a second main surface located on an opposite side of the first main surface. The first end surface may be inclined with respect to a second direction orthogonal to the first main surface so as to approach the second end surface from the first main surface toward the second main surface along the second direction. According to the above configuration, an incident angle of the second terahertz wave with respect to the first end surface can be small, and reflection (loss) of the second terahertz wave on the first end surface can be suppressed.

An inclination angle of the first end surface with respect to a plane orthogonal to the first direction may substantially coincide with an angle at which an emission direction of the first terahertz wave is inclined with respect to the first direction. According to the above configuration, by causing the second terahertz wave to be substantially perpendicularly incident on the first end surface, it is possible to substantially match the traveling direction of the third terahertz wave and the traveling direction of the first terahertz wave. As a result, phase matching between the third terahertz wave and the first terahertz wave can be achieved, and the efficiency of amplification or wavelength conversion of the third terahertz wave can be effectively improved by interaction between the third terahertz wave and the first terahertz wave.

The substrate may include: a first main surface facing the first clad layer; and a second main surface located on an opposite side of the first main surface. The second end surface may be inclined with respect to a second direction orthogonal to the first main surface so as to approach the first end surface from the first main surface toward the second main surface along the second direction. According to the above configuration, an incident angle of the third terahertz wave with respect to the second end surface can be small, and the reflection (loss) of the third terahertz wave on the second end surface can be suppressed.

An inclination angle of the second end surface with respect to a plane orthogonal to the first direction may substantially coincide with an angle at which an emission direction of the first terahertz wave is inclined with respect to the first direction. According to the above configuration, when the traveling direction of the third terahertz wave and the traveling direction of the first terahertz wave are substantially matched, phase matching between the third terahertz wave and the first terahertz wave can be achieved, and the efficiency of amplification or wavelength conversion of the third terahertz wave can be effectively improved by interaction between the third terahertz wave and the first terahertz wave. Further, in this case, since the incident angle of the third terahertz wave with respect to the second end surface can be brought close to 0 degrees, it is possible to effectively suppress reflection (loss) of the third terahertz wave on the second end surface.

The laser module may further include an incident lens that includes an incident surface on which the second terahertz wave is incident and a facing surface facing the first end surface. The facing surface of the incident lens may be in directly or indirectly contact with the first end surface. According to the above configuration, it is possible to suppress interface reflection of the second terahertz wave on the first end surface by causing the second terahertz wave to be incident on the first end surface via the incident lens, and it is possible to improve incidence efficiency of the second terahertz wave to the active layer by condensing the second terahertz wave.

The incident lens may be formed of Si. By forming the incident lens with Si having a very small absorption coefficient for terahertz wave, attenuation of the second terahertz wave in the incident lens can be suppressed.

The incident lens may be a meta-lens in which an uneven structure is formed on the incident surface. By configuring the incident lens with meta-lens, it is possible to reduce the size (suppress the thickness) of the incident lens.

The laser module may further include an exit lens that includes an exit surface that emits the third terahertz wave and a facing surface facing the second end surface, the facing surface of the exit lens may be in directly or indirectly contact with the second end surface. According to the above configuration, it is possible to improve extraction efficiency of the third terahertz wave by extracting the third terahertz wave from the second end surface to the outside via the exit lens.

The exit lens may be formed of Si. By forming the exit lens with Si having a very small absorption coefficient for terahertz wave, attenuation of the third terahertz wave in the exit lens can be suppressed.

The exit lens may be a meta-lens in which an uneven structure is formed on the exit surface. By configuring the exit lens with meta-lens, it is possible to reduce the size (suppress the thickness) of the exit lens.

The first end surface of the substrate may protrude to the first side more than the third end surface of the active layer in the first direction. According to the above configuration, it is possible to easily perform a process (for example, a polishing process) of processing the first end surface into an inclined surface.

The second end surface of the substrate may protrude to the second side more than the fourth end surface of the active layer in the first direction. According to the above configuration, it is possible to easily perform a process (for example, a polishing process) of processing the second end surface into an inclined surface.

The substrate may include: a first end surface located on a first side in a first direction which is a resonance direction of the quantum cascade laser element; and a second end surface located on a second side opposite to the first side in the first direction. The active layer may include: a third end surface located on the first side in the first direction; and a fourth end surface located on the second side in the first direction. The substrate may include: a first main surface facing the first clad layer; and a second main surface located on an opposite side of the first main surface. The first end surface may be inclined with respect to a second direction orthogonal to the first main surface so as to approach the second end surface from the first main surface toward the second main surface along the second direction. The first end surface of the substrate may protrude to the first side more than the third end surface of the active layer in the first direction. The second terahertz wave may be incident on the first main surface along the second direction, passes through an inside of the substrate, and is reflected by the first end surface and the second main surface to be incident on the active layer. According to the above configuration, since the incident surface of the second terahertz wave and the exit surface of the third terahertz wave can be largely separated from each other, it is possible to easily avoid interference between the light source that outputs the second terahertz wave and the member that captures the third terahertz wave, and it is possible to improve design flexibility regarding the arrangement of each member.

The substrate may include: a first end surface located on a first side in a first direction which is a resonance direction of the quantum cascade laser element; and a second end surface located on a second side opposite to the first side in the first direction. The active layer may include: a third end surface located on the first side in the first direction; and a fourth end surface located on the second side in the first direction. The substrate may include: a first main surface facing the first clad layer; and a second main surface located on an opposite side of the first main surface. The first end surface may be inclined with respect to a second direction orthogonal to the first main surface so as to approach the second end surface from the second main surface toward the first main surface along the second direction. The first end surface of the substrate may protrude to the first side more than the third end surface of the active layer in the first direction. The second terahertz wave may be incident on the second main surface along the second direction, passes through an inside of the substrate, and is reflected by the first end surface to be incident on the active layer. According to the above configuration, since the incident surface of the second terahertz wave and the exit surface of the third terahertz wave can be largely separated from each other, it is possible to easily avoid interference between the light source that outputs the second terahertz wave and the member that captures the third terahertz wave, and it is possible to improve design flexibility regarding the arrangement of each member.

According to an aspect of the present disclosure, it is possible to provide a laser module capable of improving efficiency of amplification or wavelength conversion of a terahertz wave.

DETAILED DESCRIPTION

Figure 1:
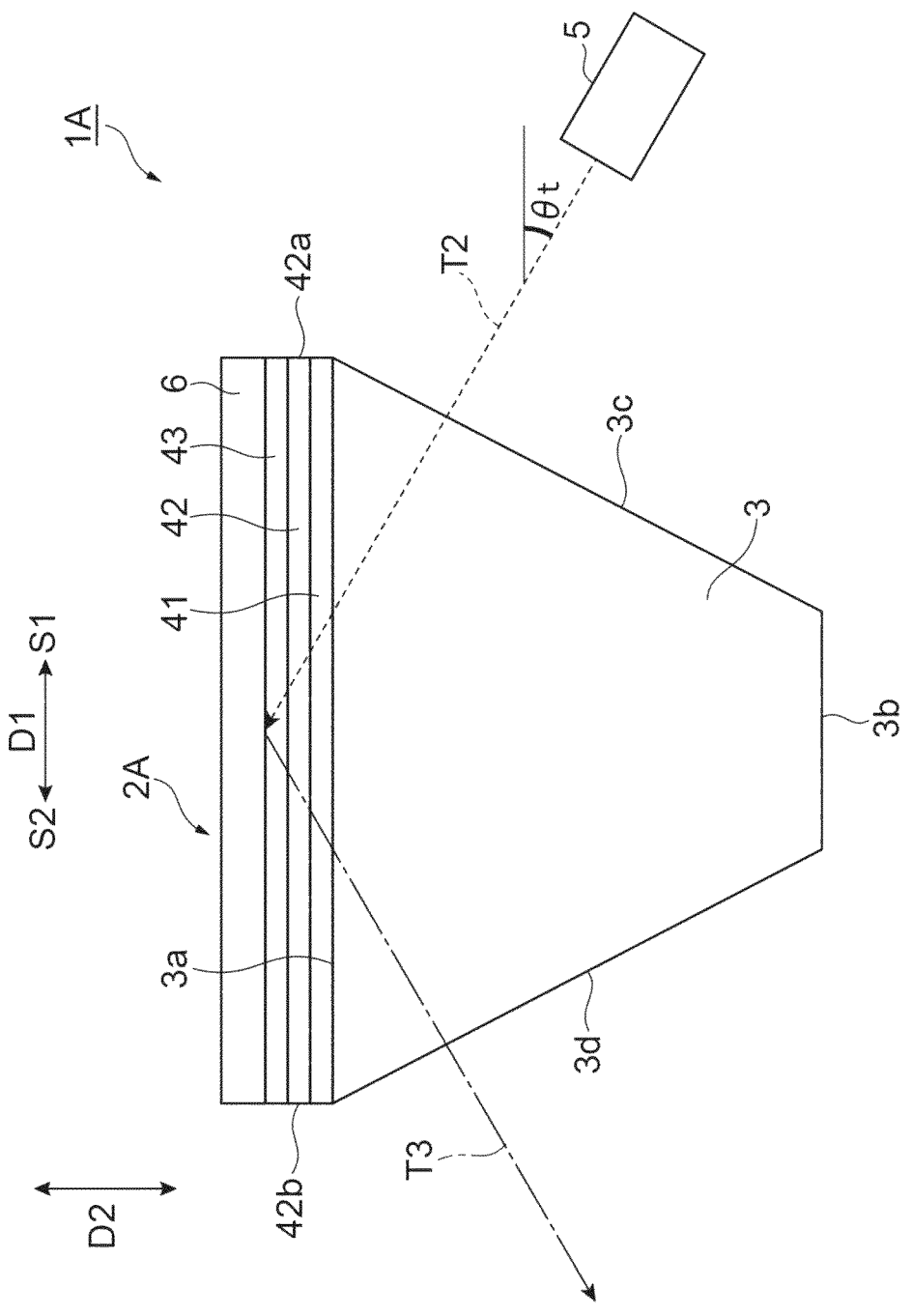
FIG. 1 is a schematic configuration diagram of a laser module of a first embodiment.

Hereinafter, an embodiment of the present disclosure will be described in detail with reference to the drawings. In the following description, the same or corresponding elements are denoted by the same reference numerals, and redundant description is omitted. Further, terms such as "upper" and "lower" are used for convenience based on the state shown in the drawings. In the drawings, some features of the embodiments are exaggerated for easy understanding. Therefore, the dimensional ratio of each part in the drawings may be different from the actual dimensional ratio.

First Embodiment

A laser module 1A according to the first embodiment will be described with reference to FIGS. 1 to 3. As shown in FIG. 1, the laser module 1A includes a quantum cascade laser element 2A (hereinafter referred to as a "QCL element 2A") and a light source 5. The QCL element 2A generates a terahertz wave T1 (first terahertz wave) having a difference $\omega3$ ($=|\omega1-\omega2|$) between the first frequency $\omega1$ and the second frequency @2. The light source 5 emits a terahertz wave T2 (second terahertz wave) that is different from the terahertz wave T1 to the QCL element 2A. The laser module 1A is configured to amplify or wavelength-convert the terahertz wave T2 emitted from the light source 5 by using the QCL element 2A which is a terahertz quantum cascade laser of a difference frequency generation type (DFG-THz-QCL).

Figure 2:
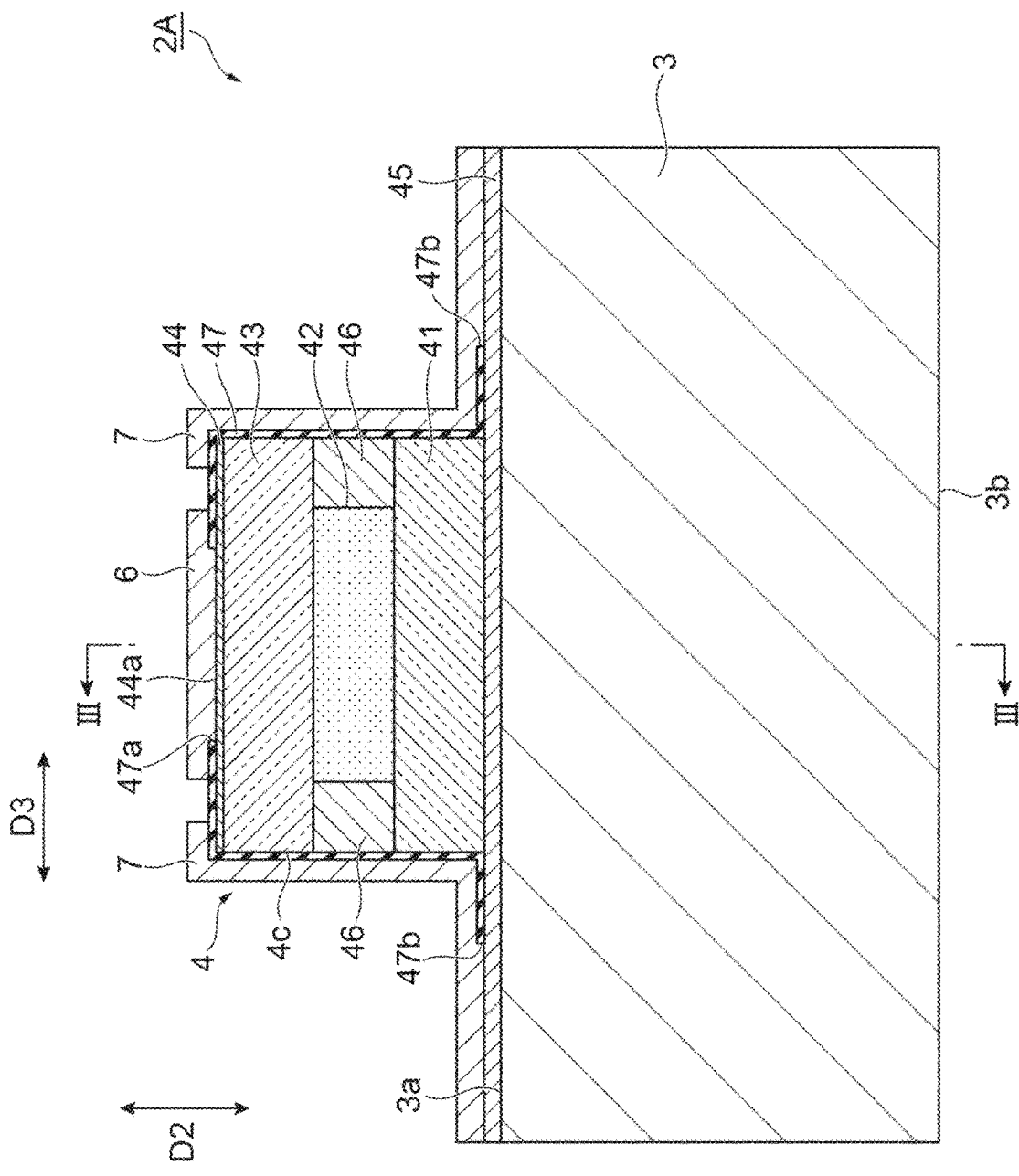
FIG. 2 is a cross-sectional view of the QCL element of FIG. 1.

FIG. 2 shows a cross section along a plane perpendicular to a resonance direction of the QCL element 2A. FIG. 3 shows a cross section along the line III-III in FIG. 2. In FIGS. 1 and 3, an upper contact layer 44 and a lower contact layer 45, which will be described later, are omitted. The direction D1 (first direction) is a resonance direction of the QCL element 2A. The direction D2 (second direction) is a stacking direction of the QCL element 2A (a stacking direction of a substrate 3, a lower clad layer 41, an active layer 42, and an upper clad layer 43 which will be described later). The direction D3 is a direction orthogonal to the directions D1 and D2.

The QCL element 2A is, for example, a terahertz light source configured to be able to output a terahertz wave T1 in a room temperature environment. The QCL element 2A includes a substrate 3, a semiconductor layer 4, a first electrode 6 (metal electrode), and a second electrode 7. The QCL element 2A can be formed as a ridge-stripe laser element by a general semiconductor process. The QCL element 2A is obtained, for example, by forming InGaAs/InAlAs on the InP substrate (substrate 3) by epitaxial growth.

The substrate 3 is, for example, a rectangular plate-shaped InP single-crystal substrate (semi-insulating substrate: highresistance semiconductor substrate not doped with impurities). A length (length in the direction D1) of the substrate 3 is about several hundred μm to several mm. A width (length in the direction D3) of the substrate 3 is about several hundred μm to several mm. A thickness (length in the direction D2) of the substrate 3 is and about several hundred μm. In the present embodiment, as an example, the length of the substrate 3 is approximately 3 mm, the width of the substrate 3 is approximately 1 mm, and the thickness of the substrate 3 is approximately 300 μm.

The substrate 3 includes an upper surface 3a (first main surface) facing the semiconductor layer 4 and a lower surface 3b (second main surface) located on an opposite side of the upper surface 3a. The substrate 3 includes an end surface 3c (first end surface) located on a first side S1 (right side in FIG. 3) in the direction D1, and an end surface 3d (second end surface) located on a second side S2 (left side in FIG. 3) opposite to the first side S1 in the direction D1.

The semiconductor layer 4 is provided on the upper surface 3a of the substrate 3. A thickness (length in the direction D2) of the semiconductor layer 4 is about 10 μm to 20 μm (for example, 15 μm). The semiconductor layer 4 includes an end surface 4a located at the first side S1 in the direction D1 and an end surface 4b located at the second side S2 in the direction D1. The semiconductor layer 4 emits broadband light in the mid-infrared region (for example, 3 μm or more and 20 μm or less) from each of the end surfaces 4a and 4b (more specifically, the end surfaces 42a and 42b of the active layer 42). The end surfaces 4a and 4b are surfaces perpendicular to the direction D1. The end surfaces 4a and 4b are cleavage surfaces formed by cleavage, for example. The QCL element 2A may have a structure in which a plurality of active layers having center wavelengths different from each other are stacked or a structure formed of a single active layer in order to emit broadband light as described above.

The semiconductor layer 4 includes a lower clad layer 41 (first clad layer), an active layer 42, an upper clad layer 43 (second clad layer), an upper guide layer (not shown), a lower guide layer (not shown), an upper contact layer 44, a lower contact layer 45, and a support layer 46.

From the upper surface 3a of the substrate 3, the lower contact layer 45, the lower clad layer 41, the lower guide layer, the active layer 42, the upper guide layer, the upper clad layer 43, and the upper contact layer 44 are laminated in this order. The upper guide layer is disposed between the active layer 42 and the upper clad layer 43. The lower guide layer is disposed between the active layer 42 and the lower clad layer 41. The support layer 46 is provided between the lower clad layer 41 and the upper clad layer 43 on both sides (both sides in the direction D3) of the active layer 42, the upper guide layer, and the lower guide layer formed in a ridge stripe shape. The lower contact layer 45 has a portion that extends outward (outward in the direction D3) from the lower clad layer 41. In this embodiment, the end portion of the lower contact layer 45 in the direction D3 coincides with the end portion of the substrate 3 in the direction D3.

The lower contact layer 45 is, for example, a high-concentration Si-doped InGaAs layer (Si: $1.0 \times 10^{18}/\mathrm{cm}^3$) with a thickness of about 400 nm, and is provided on the upper surface 3a of the substrate 3.

The lower clad layer 41 is, for example, a Si-doped InP layer (Si: $1.5 \times 10^{16}/\mathrm{cm}^3$) with a thickness of about 5 μm, and is provided on the lower contact layer 45. That is, the lower clad layer 41 is provided on the upper surface 3a of the substrate 3 via the lower contact layer 45.

The lower guide layer is, for example, a Si-doped InGaAs layer (Si: $1.5 \times 10^{16}/\mathrm{cm}^3$) with a thickness of about 250 nm, and is provided on the lower clad layer 41.

The active layer 42 is a layer in which a quantum cascade structure is formed, and is provided on the lower guide layer. That is, the active layer 42 is provided on an opposite side of the lower clad layer 41 from the substrate 3. As shown in FIG. 3, the active layer 42 has an end surface 42a (third end surface) located on the first side S1 in the direction D1 and an end surface 42b (fourth end surface) located on the second side S2 in the direction D1. The end surface 42a is a part of the end surface 4a of the semiconductor layer 4. The end surface 42b is a part of the end surface 4b of the semiconductor layer 4. As an example, the active layer 42 has a structure in which a plurality of InGaAs layers and InAlAs layers are alternately stacked along the direction D2.

The upper guide layer is, for example, a Si-doped InGaAs layer (Si: $1.5 \times 10^{16}/\mathrm{cm}^3$) with a thickness of about 450 nm, and is provided on the active layer 42.

The upper clad layer 43 is, for example, Si-doped InP layer (Si: $1.5 \times 10^{16}/\mathrm{cm}^3$) with a thickness of about 5 μm, and is provided on the upper guide layer. That is, the upper clad layer 43 is provided on an opposite side of the active layer 42 from the lower clad layer 41.

The upper contact layer 44 is, for example, a high-concentration Si-doped InP layer (Si: $1.5 \times 10^{18}/\mathrm{cm}^3$) with a thickness of about 15 nm, and is provided on the upper clad layer 43.

The support layer 46 is, for example, an Fe-doped InP layer.

As shown in FIG. 2, an insulating film 47 is formed so as to cover an upper surface 44a of the upper contact layer 44, the end surface 4c of the semiconductor layer 4 intersecting the direction D3, and a part of the lower contact layer 45. The insulating film 47 is formed of, for example, SiN. A contact hole 47a is formed in the insulating film 47 to expose a portion of the upper surface 44a of the upper contact layer 44. The contact hole 47a extends along the direction D1 (see FIG. 3) so as to expose a central portion of the upper surface 44a in the direction D3. Further, in the direction D3, an end portion 47b of the insulating film 47 on the lower contact layer 45 is located inside the end portion of the lower contact layer 45. In other words, the upper surface of the lower contact layer 45 is exposed outside the end portion 47b of the insulating film 47.

The first electrode 6 is formed on the upper surface 44a of the upper contact layer 44. The first electrode 6 is formed of a metal such as Ti/Au. That is, the first electrode 6 is provided on an opposite side of the upper clad layer 43 from the active layer 42. The first electrode 6 is electrically connected to a part of the upper surface 44a of the upper contact layer 44 via the contact hole 47a.

The second electrode 7 is formed on the lower contact layer 45 so as to be in contact with a portion of the lower contact layer 45 that is exposed outside the end portion 47b of the insulating film 47. The second electrode 7 is formed of a metal such as Ti/Au. In the present embodiment, the second electrode 7 is formed so as to cover the end surface and a part of the upper surface of the semiconductor layer 4, but is not necessarily formed in this manner. That is, the second electrode 7 may be formed so as to be electrically connected to at least the lower contact layer 45 and separated from the first electrode 6. According to the above configuration, it is possible to drive the QCL element 2A by causing a current to flow from the second electrode 7 to the first electrode 6.

As an example, in the QCL element 2A, by providing two types of diffraction grating layers functioning as a distributed feedback (DFB) structure in the upper guide layer, generation of first pump light of a first frequency ω1 and second pump light of a second frequency ω2 and generation of a terahertz wave T1 of a difference frequency ω3 can be realized. The diffraction grating layer may be provided inside a clad layer (for example, the upper clad layer 43). Light of a first frequency ω1 (hereinafter referred to as "first light") and light of a second frequency ω2 (hereinafter referred to as "second light") are mid-infrared light.

The active layer 42 constitutes a resonator that oscillates the first light and the second light. As an example, the end surfaces 42a and 42b of the active layer 42 function as reflection surfaces that reflect the first light and the second light into the active layer 42 so as to confine the first light and the second light in the active layer 42. However, the end surfaces 42a and 42b do not necessarily have to function as the reflecting surfaces. For example, when an external resonator (for example, a diffraction grating) other than the QCL element 2A is disposed and used at a position facing the end surface 42a, at least one of the first light and the second light may be emitted from the end surface 42a to the external resonator, and light diffracted and reflected by the external resonator may be returned to the end surface 42a. The active layer 42 generates a terahertz wave T1 of a difference frequency ω3 (=|ω1−ω2|) between the first frequency ω1 of the first light and the second frequency ω2 of the second light by difference frequency generation due to Cherenkov phase matching.

Figure 3:
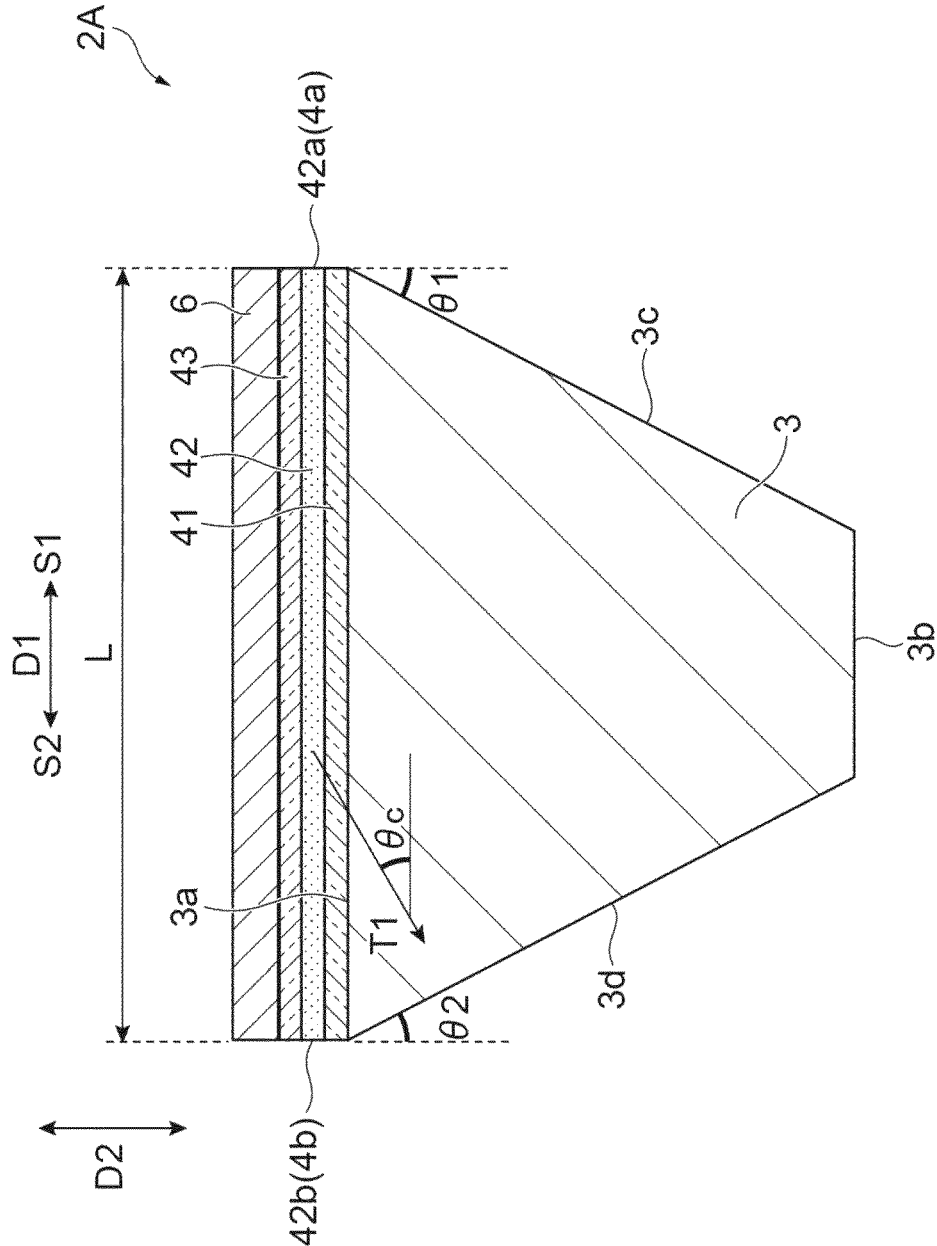
FIG. 3 is a schematic cross-sectional view of the QCL element taken along line III-III of FIG. 2.

As shown in FIG. 3, the radiation direction of the terahertz wave T1 generated in this manner is inclined downward (toward the substrate 3) by a radiation angle $\theta_C$ (Cherenkov radiation angle) with respect to a direction from the first side S1 toward the second side S2 (leftward direction in FIG. 3) along the resonance direction (direction D1). More specifically, the terahertz wave T1 generated by the active layer 42 propagates as a plane wave (that is, in phase) in the substrate 3 at a radiation angle $\theta_C$ expressed by the following Equation (1). In the following Equation (1), $n_{MIR}$ is a group index of refraction of the substrate 3 with respect to mid-infrared light, and $n_{THz}$ is an index of refraction of the substrate 3 with respect to terahertz wave. The radiation angle $\theta_C$ depends on the material of the substrate 3 (that is, the index of refraction corresponding to the material) and the frequencies of the terahertz wave T1, but is, for example, 5 degrees to 30 degrees. In the present embodiment, as an example, the radiation angle $\theta_C$ is 20 degrees.

$$\theta_C = \cos^{-1}(n_{MIR}/n_{THz}) \qquad (1)$$

As shown in FIG. 3, the end surface 3c of the substrate 3 is inclined with respect to the direction D2 so as to approach the end surface 3d (that is, so as to move to the second side S2) from the upper surface 3a toward the lower surface 3b along the direction D2. On the other hand, the end surface 3d of the substrate 3 is inclined with respect to the direction D2 so as to approach the end surface 3c (that is, so as to move to the first side S1) from the upper surface 3a toward the lower surface 3b along the direction D2. In other words, in the present embodiment, when viewed from the direction D3, the substrate 3 is formed in a tapered shape that tapers from the upper surface 3a toward the lower surface 3b. The inclination angle $\theta_1$ of the end surface 3c with respect to the plane orthogonal to the direction D1 substantially coincides with the angle at which the emission direction of the terahertz wave T1 from the active layer 42 is inclined with respect to the direction D1 (that is, the above-described radiation angle $\theta_C$). Similarly, the inclination angle $\theta_2$ of the end surface 3d with respect to a plane orthogonal to the direction D1 also substantially coincides with the radiation angle $\theta_C$.

As shown in FIG. 1, in the present embodiment, the light source 5 is disposed at a position facing the end surface 3c. The terahertz wave T2 emitted by the light source 5 enters the active layer 42 via the substrate 3. That is, the terahertz wave T2 passes through the inside of the substrate 3, transmits through the lower clad layer 41, and is incident on the lower surface (surface facing the lower clad layer 41) of the active layer 42. The terahertz wave T2 incident on the active layer 42 passes through the upper clad layer 43 and is reflected by the first electrode 6. The interaction between the terahertz wave T2 and the active layer 42 also results in amplification or wavelength-conversion of the terahertz wave T2 passing through the active layer 42. A terahertz wave T3 (third terahertz wave) which is reflected by the first electrode 6 and amplified or wavelength-converted by interaction with the active layer 42 is emitted to the outside through the substrate 3.

Here, the amplification of the terahertz wave T2 means that the light amount (light intensity) of the terahertz wave T3 emitted from the substrate 3 is larger than the light amount (light intensity) of the terahertz wave T2 emitted from the light source 5. Further, the wavelength-conversion of the terahertz wave T2 means that the wavelength of the terahertz wave T3 emitted from the substrate 3 is changed from the wavelength of the terahertz wave T2 emitted from the light source 5. The interaction between the terahertz wave T2 incident on the active layer 42 and the active layer 42 may cause both the amplification and the wavelength-conversion described above or may cause only one of the amplification and the wavelength-conversion.

As illustrated in FIG. 1, in the present embodiment, the terahertz wave T2 emitted from the light source 5 is incident on the end surface 3c of the substrate 3 along a direction inclined with respect to the direction D1 so as to approach the active layer 42 from the first side S1 toward the second side S2 in the direction D1. An angle θt at which the emission direction of the terahertz wave T2 is inclined with respect to the direction D1 is adjusted to be substantially equal to, for example, the inclination angle θ1. In this case, since the incident angle of the terahertz wave T2 with respect to the end surface 3c can be brought close to 0 degrees, the reflection of the terahertz wave T2 in the end surface 3c can be suppressed. As a result, the terahertz wave T2 can be efficiently introduced into the substrate 3.

On the other hand, the terahertz wave T3 is emitted from the end surface 3d of the substrate 3 along a direction inclined with respect to the direction D1 so as to move away from the active layer 42 from the first side S1 toward the second side S2 in the direction D1. In the present embodiment, since the inclination angle θ2 is equal to the inclination angle θ1, when the angle θt is adjusted to be substantially equal to the inclination angle θ1, the incident angle of the terahertz wave T3 with respect to the end surface 3d can be brought close to 0 degrees, and thus the reflection of the terahertz wave T3 in the end surface 3d can be suppressed. As a result, the terahertz wave T3 can be efficiently taken out to the outside.

According to the laser module 1A described above, the terahertz wave T2 emitted from the light source 5 can be amplified or wavelength-converted by using the QCL element 2A that generates the terahertz wave T1 by generating a difference frequency. In the laser module 1A, the terahertz wave L2 emitted from the light source 5 is incident on the substrate 3 instead of the end surface 42a or 42b of the active layer 42. That is, the terahertz wave T2 passes through the inside of the substrate 3 and enters the active layer 42 (that is, a surface of the active layer 42 facing the substrate 3). According to this method, as compared with a method in which the terahertz wave T2 is incident on the end surface 42a or 42b of the active layer 42, the terahertz wave T2 can be easily incident on the active layer 42, and absorption of the terahertz wave T2 by the active layer 42 can be suppressed. That is, if the terahertz wave T2 is incident into the active layer 42 along a direction parallel to the resonance direction (direction D1), the terahertz wave T2 passes through the active layer 42 by a long distance, and thus the absorption amount of the terahertz wave T2 in the active layer 42 increases. On the other hand, by causing the terahertz wave T2 to enter the active layer 42 via the substrate 3 as in the present embodiment, the incident direction of the terahertz wave T2 with respect to the active layer 42 can be inclined with respect to the resonance direction (direction D1). As a result, since the length of the terahertz wave T2 passing through the active layer 42 can be made shorter than that in the above case, the absorption amount of the terahertz wave T2 in the active layer 42 can be reduced. In addition, since the terahertz wave T2 is reflected by the first electrode 6 located on the opposite side of the active layer 42 from the substrate 3, the terahertz wave T2 amplified or wavelength-converted by the active layer 42 (that is, the terahertz wave T3) can be easily extracted to the outside via the substrate 3 again. As described above, according to the laser module 1A, the efficiency of amplification or wavelength-conversion of the terahertz wave T2 can be improved.

The substrate 3 is formed of InP. According to the above configuration, since the substrate 3 is formed of a material having a small absorption coefficient for the terahertz wave T2, loss (attenuation) of the terahertz wave T2 and T3 passing through the substrate 3 can be suppressed, and the light amount of the terahertz wave T3 taken out to the outside can be improved. From the same viewpoint, the substrate 3 may be formed of Si (silicon). Since Si has a smaller absorption coefficient for terahertz wave T2 than InP, the above-described effect can be further enhanced.

The length L (see FIG. 3) of the active layer 42 in the resonance direction of the QCL element 2A (direction D1) is 100 μm to 3 mm. The length L can be preferably set to 100 μm to 1 mm. More preferably, the length L is set to be substantially equal to the wave length of the terahertz wave T2 (for example, 300 μm). According to the above configuration, a configuration (see FIG. 1) in which the terahertz wave T2 can be taken out to the outside by reflecting the terahertz wave T3 once by the first electrode 6 can be suitably realized. That is, it is possible to prevent the terahertz wave T2 from being multiply reflected in the QCL element 2A (see a second embodiment (FIG. 4) described later). Accordingly, the loss of the terahertz wave T2 in the QCL element 2A due to the multiple reflection can be reduced, and as a result, the light amount of the terahertz wave T3 can be improved.

The terahertz wave T2 is incident on the end surface 3c along a direction inclined with respect to the direction D1 so as to approach the active layer 42 from the first side S1 toward the second side S2 in the direction D1. According to the above configuration, the terahertz wave T2 can be made incident from the end surface 3c of the substrate 3 and reliably guided to the active layer 42, and can be reliably reflected by the first electrode 6 and extracted to the outside.

Further, the end surface 3c is inclined with respect to the direction D2 so as to approach the end surface 3d from the upper surface 3a toward the lower surface 3b along the direction D2. According to the above configuration, the incident angle of the terahertz wave T2 with respect to the end surface 3c can be small, and the reflection (loss) of the terahertz wave T2 in the end surface 3c can be suppressed.

The inclination angle θ1 of the end surface 3c is substantially equal to the radiation angle θc of the terahertz wave T1. According to the above configuration, by making the terahertz wave T2 substantially perpendicularly incident on the end surface 3c, it is possible to substantially match the traveling direction of the terahertz wave T3 and the traveling direction of the terahertz wave T1. As a result, phase matching between the terahertz wave T3 and the terahertz wave T1 can be achieved, and efficiency of amplification or wavelength-conversion of the terahertz wave T3 can be effectively improved by interaction between the terahertz wave T1 and the terahertz wave T3.

Further, the terahertz wave T3 is emitted from the end surface 3d along a direction inclined with respect to the direction D1 so as to move away from the active layer 42 from the first side S1 toward the second side S2 in the direction D1. According to the above configuration, since it is possible to extract the output light (terahertz wave T3) from the end surface 3d opposite to the end surface 3c which is an incident surface of the terahertz wave T2, it is possible to easily avoid interference between the light source 5 which outputs the terahertz wave T2 and a member (not illustrated) which captures the terahertz wave T3, and it is possible to improve design flexibility regarding arrangement of each member. The terahertz wave T2 emitted from the light source 5 may enter the end surface 3c via another member such as a mirror member, and the light source 5 itself does not necessarily need to be disposed at a position facing the end surface 3c. Even in such a case, according to the above-described configuration, there is an effect that it is possible to avoid interference between the another member disposed at a position facing the end surface 3c and the member which captures the terahertz wave T3.

Further, the end surface 3d is inclined with respect to the direction D2 so as to approach the end surface 3c from the upper surface 3a toward the lower surface 3b along the direction D2. According to the above configuration, the incident angle of the terahertz wave T3 with respect to the end surface 3d can be small, and the reflection (loss) of the terahertz wave T3 in the end surface 3d can be suppressed.

The inclination angle θ2 of the end surface 3d is substantially equal to the radiation angle $θ_C$ of the terahertz wave T1. According to the above configuration, when the traveling direction of the terahertz wave T3 substantially matches the traveling direction of the terahertz wave T1, phase matching between the terahertz wave T3 and the terahertz wave T1 can be achieved, and efficiency of amplification or wavelength-conversion of the terahertz wave T3 can be effectively improved by interaction between the terahertz wave T1 and the terahertz wave T3. Further, in this case, since the incident angle of the terahertz wave T3 with respect to the end surface 3d can be brought close to 0 degrees, it is possible to effectively suppress reflection (loss) of the terahertz wave T3 in the end surface 3d.

Second Embodiment

Figure 4:
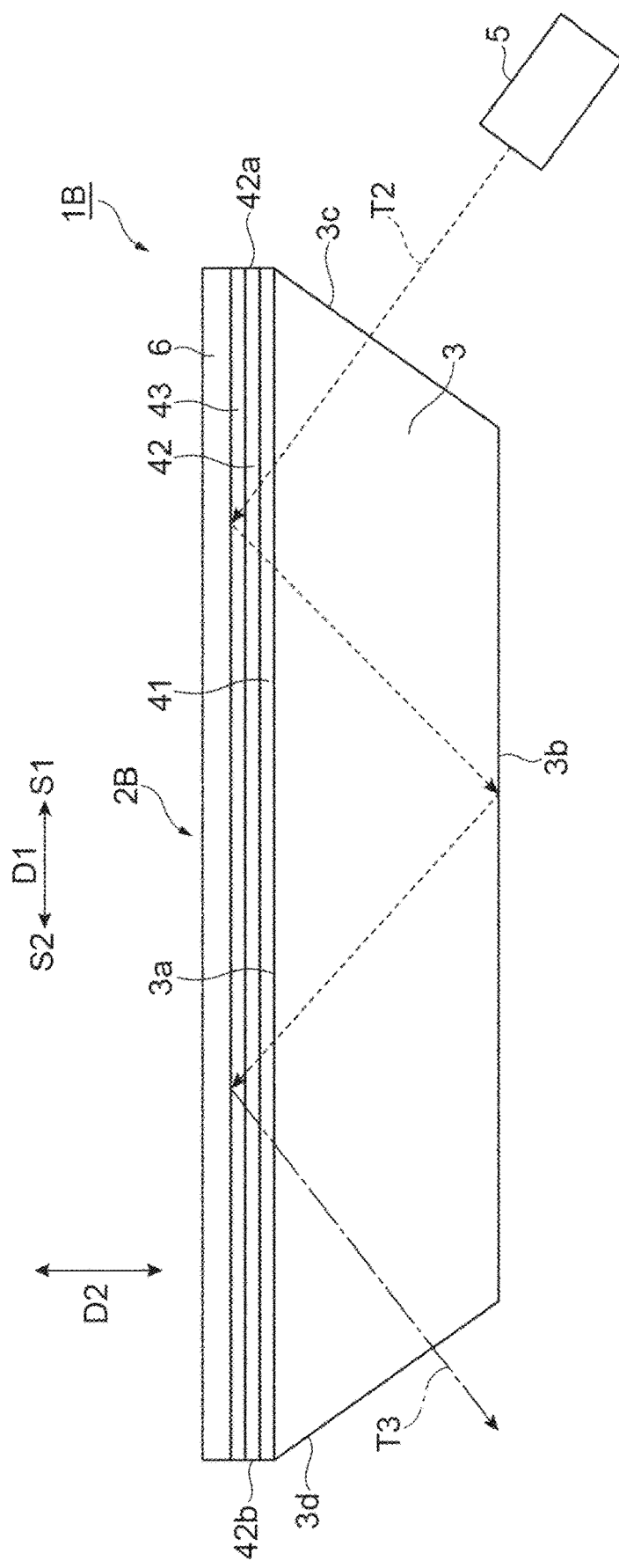
FIG. 4 is a schematic configuration diagram of a laser module of a second embodiment.

The laser module 1B of the second embodiment will be described with reference to FIG. 4. The laser module 1B is different from the laser module 1A in that it includes a QCL element 2B that is longer in the direction D1 than the QCL element 2A. The substrate 3 of the QCL element 2B is formed of Si.

In the laser module 1B, after the terahertz wave T2 is first reflected by the first electrode 6 and before the terahertz wave T2 is emitted to the outside as the terahertz wave T3, the terahertz wave T2 is reflected by the lower surface 3b of the substrate 3 at least once or more (only once as an example in the present embodiment) and re-enter the active layer 42. In other words, the laser module 1B is configured such that the terahertz wave T2 undergoes multiple reflection inside the QCL element 2B. In this embodiment, the terahertz wave T3 after being reflected by the first electrode 6 for the second time is emitted from the end surface 3d. The number of reflections of the terahertz wave T2 on the lower surface 3b of the substrate 3 may be one as in the present embodiment or may be two or more. The number of reflections of the terahertz wave T2 at the lower surface 3b depends on the incident angle of the terahertz wave T2 (angle θt in FIG. 1) and the length of the QCL element 2B (in the direction D1).

According to the second embodiment, since the terahertz wave T2 is multiply reflected in the QCL element 2B, the terahertz wave T2 can be incident on the active layer 42 a plurality of times (two times in the present embodiment). Therefore, the efficiency of amplification or wavelength-conversion can be effectively improved by increasing the number of times of amplification or wavelength-conversion of the terahertz wave T2. As described in the first embodiment, when the terahertz wave T2 is multiply reflected in the QCL element 2B, the loss of the terahertz wave T2 in the QCL element 2B becomes larger than that when the terahertz wave T2 is not multiply reflected. However, by forming the substrate 3 with Si, it is possible to effectively suppress the loss of the terahertz wave T2 (absorption into the substrate 3). That is, according to the second embodiment, it is possible to obtain a merit of multiple reflection (improvement in efficiency of amplification or wavelength-conversion of the terahertz wave T2) while suppressing a demerit of multiple reflection (loss of the terahertz wave T2).

Third Embodiment

Figure 5:
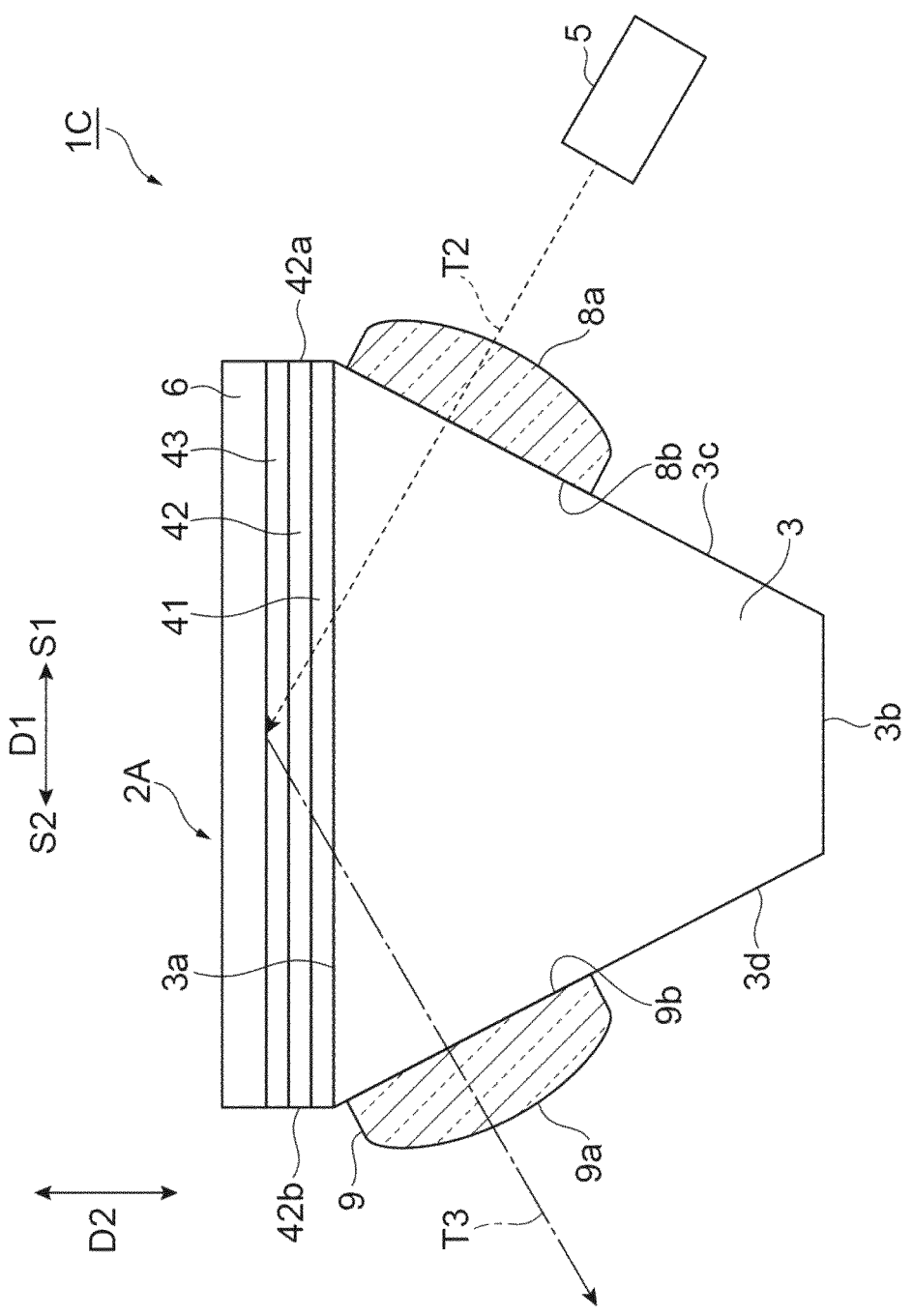
FIG. 5 is a schematic configuration diagram of a laser module of a third embodiment.

The laser module 1C of the third embodiment will be described with reference to FIG. 5. The laser module 1C is different from the laser module 1A in that it includes a lens 8 (incident lens) and a lens 9 (exit lens).

The lens 8 includes an incident surface 8a on which the terahertz wave T2 is incident, and a facing surface 8b facing the end surface 3c. The facing surface 8b of the lens 8 is in directly or indirectly contact with the end surface 3c. In the example of FIG. 5, the facing surface 8b is in directly contact with the end surface 3c, but a spacer member having an index of refraction substantially equal to that of the lens 8 may be interposed between the facing surface 8b and the end surface 3c. That is, the facing surface 8b may be in indirectly contact with the end surface 3c via the spacer member. By causing the terahertz wave T2 to be incident on the end surface 3c via the lens 8, it is possible to suppress interface reflection of the terahertz wave T2 in the end surface 3c, and it is possible to improve incident efficiency of the terahertz wave T2 on the active layer 42 by condensing the terahertz wave T2.

The lens 9 includes an exit surface 9a that emits the terahertz wave T3 and a facing surface 9b facing the end surface 3d. The facing surface 9b of lens 9 is in directly or indirectly contact with the end surface 3d. In the example of FIG. 5, the facing surface 9b is in directly contact with the end surface 3d, but a spacer member having an index of refraction substantially equal to that of the lens 9 may be interposed between the facing surface 9b and the end surface 3d. That is, the facing surface 9b may be in indirectly contact with the end surface 3d via the spacer member. By extracting the terahertz wave T3 from the end surface 3d to the outside through the lens 9, extraction efficiency of the terahertz wave T3 may be improved.

The lenses 8 and 9 may be formed of Si. That is, the lenses 8 and 9 may be silicon lenses. By forming the lenses 8 and 9 with Si having a very small absorption coefficient for terahertz wave, attenuation of the terahertz waves T2 and T3 in the lenses 8 and 9 can be suppressed.

Alternatively, the lenses 8 and 9 may be meta-lenses in which an uneven structure is formed on the incident surface 8a or the exit surface 9a. As such a meta-lens, for example, an optical element for a terahertz wave disclosed in Japanese Patent Application Laid-Open No. 2021-099399 or Japanese Patent Application Laid-Open No. 2021-099400 can be used. By configuring the lenses 8 and 9 with meta-lenses, it is possible to reduce the size (suppress the thickness) of the lenses 8 and 9.

Fourth Embodiment

Figure 6:
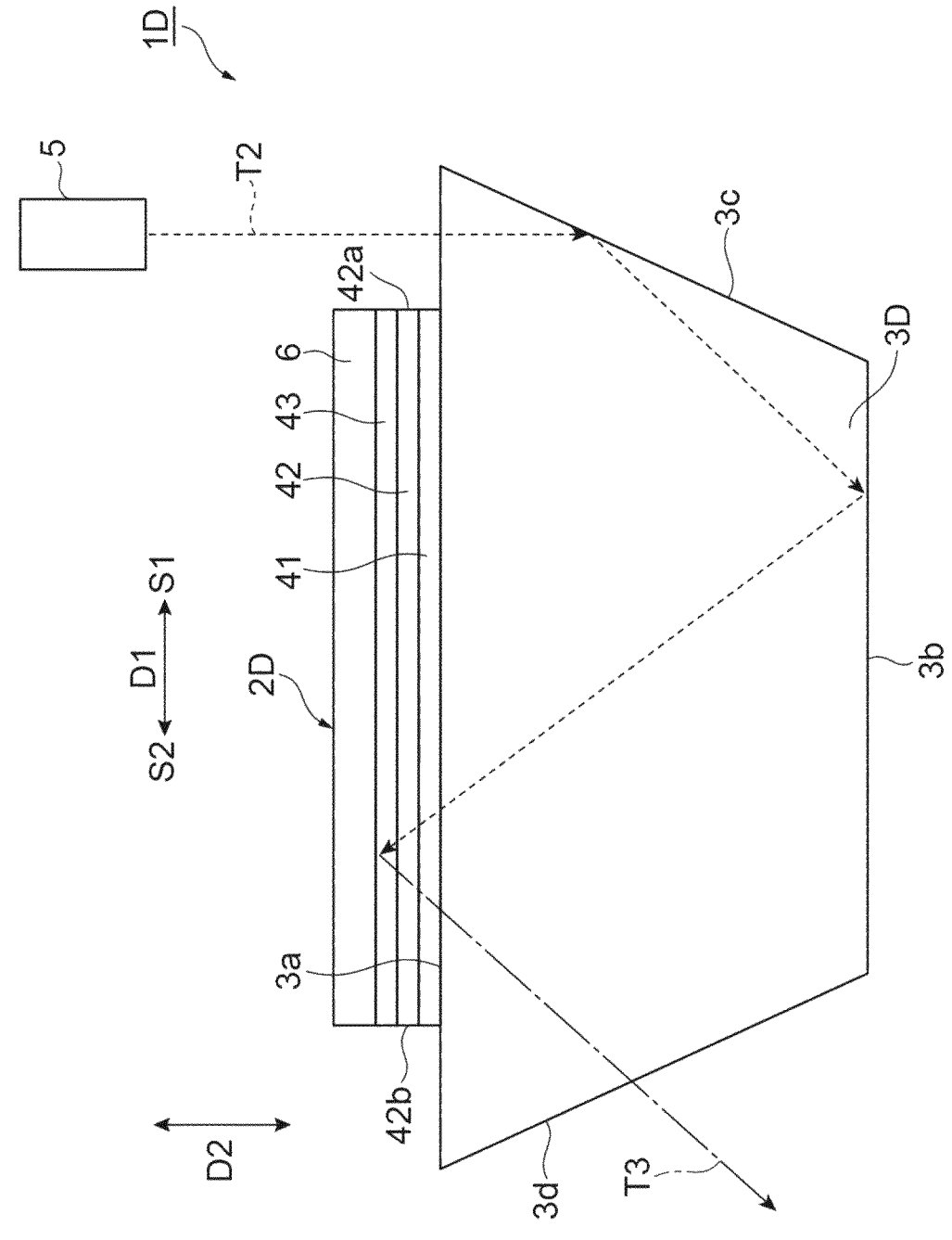
FIG. 6 is a schematic configuration diagram of a laser module of a fourth embodiment.

The laser module 1D of the fourth embodiment will be described with reference to FIG. 6. The laser module 1D is different from the laser module 1A in that a QCL element 2D is provided instead of the QCL element 2A. In addition, in the laser module 1D, the incident direction of the terahertz wave T2 with respect to the QCL element 2D is different from that of the laser module 1A. The QCL element 2D differs from the QCL element 2A in that the substrate 3D is provided in place of the substrate 3.

The end surface 3c of the substrate 3D protrudes to the first side S1 more than the end surface 42a of the active layer 42 in the direction D1. According to the above configuration, it is possible to easily perform a process (for example, a polishing process) of processing the end surface 3c into an inclined surface. That is, it is possible to easily perform a process of forming the inclined surface (end surface 3c) by polishing the end surface of the substrate 3D originally formed as a surface parallel to the direction D2. More specifically, it is possible to reduce the possibility that the semiconductor layer 4 is damaged due to contact with the semiconductor layer 4 during the polishing process.

The end surface 3d of the substrate 3D protrudes to the second side S2 more than the end surface 42b of the active layer 42 in the direction D1. According to the above configuration, it is possible to easily perform a process (for example, a polishing process) of processing the end surface 3d into an inclined surface. That is, it is possible to easily perform a process of forming the inclined surface (end surface 3d) by polishing the end surface of the substrate 3D originally formed as a surface parallel to the direction D2. More specifically, it is possible to reduce the possibility that the semiconductor layer 4 is damaged due to contact with the semiconductor layer 4 during the polishing process.

In addition, in the laser module 1D, the upper surface 3a of the substrate 3D protrudes to the first side S1 more than the end surface 42a of the active layer 42 in the direction D1, and the light source 5 is disposed at a position facing a portion of the upper surface 3a which protrudes to the first side S1 more than the end surface 42a. The terahertz wave T2 emitted from the light source 5 is incident on the upper surface 3a along the direction D2 (a direction perpendicular to the upper surface 3a), passes through the inside of the substrate 3D, and is reflected by the end surface 3c and the lower surface 3b to be incident on the active layer 42. That is, the terahertz wave T2 incident on the substrate 3D from the upper surface 3a is reflected by the end surface 3c, is further reflected by the lower surface 3b, passes through the substrate 3D, and reaches the active layer 42. Thereafter, the terahertz wave T2 is reflected by the first electrode 6, becomes a terahertz wave T3, and is emitted from the end surface 3d to the outside. According to the above-described configuration, the incident surface of the terahertz wave T2 (a portion of the upper surface 3a protruding further to the first side S1 than the end surface 42a) and the exit surface of the terahertz wave T3 (end surface 3d) can be largely separated from each other. Accordingly, it is possible to easily avoid interference between the light source 5 that outputs the terahertz wave T2 and a member (not illustrated) that captures the terahertz wave T3, and it is possible to improve design flexibility regarding arrangement of each member.

Fifth Embodiment

Figure 7:
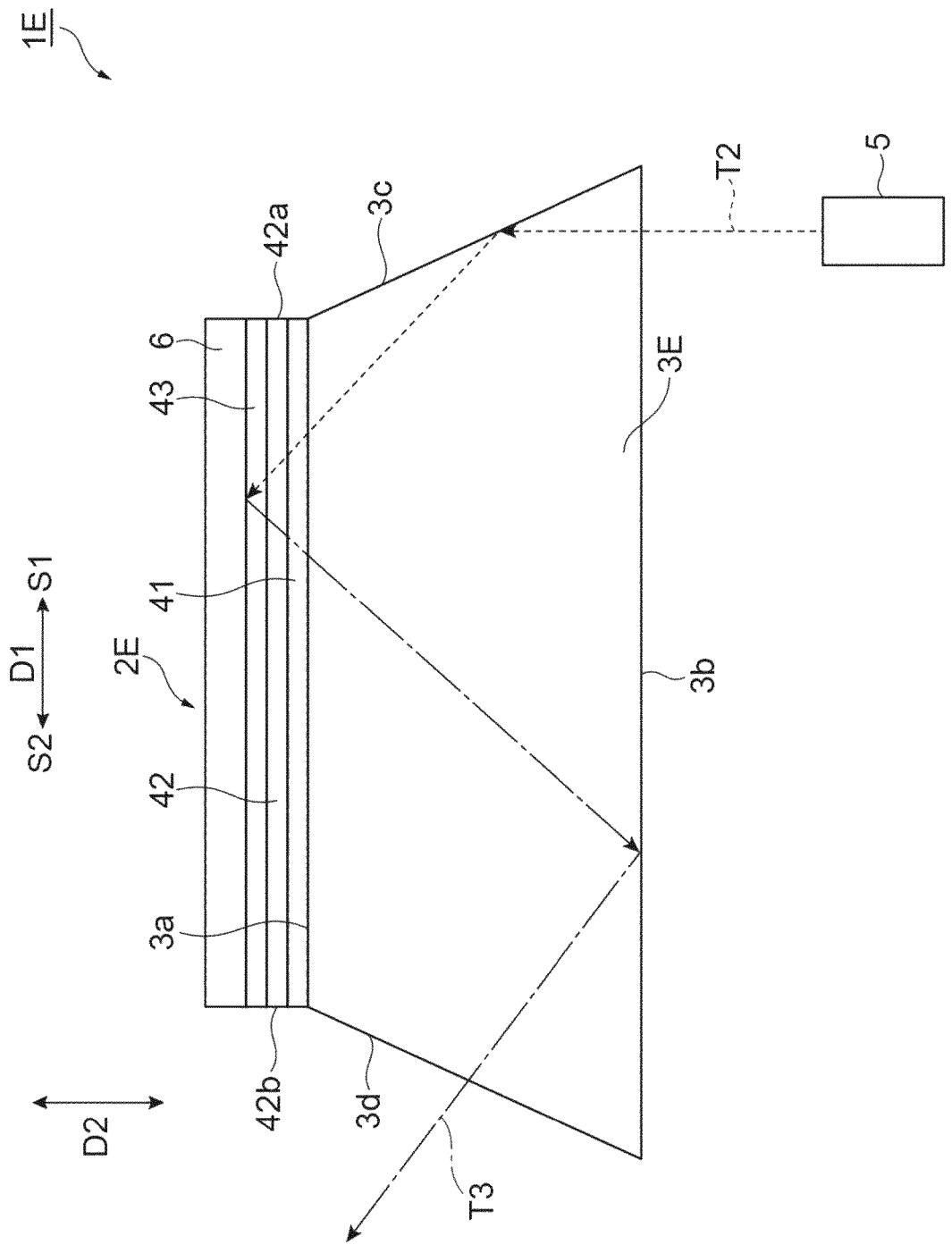
FIG. 7 is a schematic configuration diagram of a laser module of a fifth embodiment.

The laser module 1E of the fifth embodiment will be described with reference to FIG. 7. The laser module 1E is different from the laser module 1A in that a QCL element 2E is provided instead of the QCL element 2A. In addition, in the laser module 1E, the incident direction of the terahertz wave T2 with respect to the QCL element 2E is different from that of the laser module 1A. The QCL element 2E differs from the QCL element 2A in that the substrate 3E is provided in place of the substrate 3.

The end surface 3c of the substrate 3E is inclined with respect to the direction D2 so as to approach the end surface 3d from the lower surface 3b toward the upper surface 3a along the direction D2. The end surface 3c of the substrate 3E protrudes to the first side S1 more than the end surface 42a of the active layer 42 in the direction S1. More specifically, in the direction D1, the end portion of the upper surface 3a of the substrate 3E at the first side S1 is located at the same position as that of the end surface 42a of the active layer 42, but the end portion of the lower surface 3b of the substrate 3E at the first side S1 is located at a position that is farther away toward the first side S1 than the end surface 42a of the active layer 42. Note that, in the present embodiment, the end portion of the upper surface 3a of the substrate 3E at the second side S2 is located at the same position as the end surface 42b of the active layer 42, and the end portion of the lower surface 3b of the 3E at the second side S2 is located at a position that is farther away toward the second side S2 than the end surface 42b of the active layer 42. The light source 5 is disposed at a position facing a portion of the lower surface 3b that protrudes from the end surface 42a toward the first side S1. The terahertz wave T2 emitted from the light source 5 is incident on the lower surface 3b along the direction D2 (a direction orthogonal to the lower surface 3b), passes through the inside of the substrate 3E, is reflected by the end surface 3c, and is incident on the active layer 42.

That is, the terahertz wave T2 incident on the substrate 3E from the lower surface 3b is reflected by the end surface 3c and then passes through the inside of the substrate 3E to reach the active layer 42. Thereafter, the terahertz wave T2 is reflected by the first electrode 6. In the example of FIG. 7, the terahertz wave T3 reflected by the first electrode 6 is reflected by the lower surface 3b of the substrate 3E and is emitted to the outside from the end surface 3d. According to the above configuration, the incident surface of the terahertz wave T2 (a portion of the lower surface 3b protruding further to the first side S1 than the end surface 42a) and the exit surface of the terahertz wave T3 (end surface 3d) can be largely separated from each other. Accordingly, similarly to the fourth embodiment, it is possible to easily avoid interference between the light source 5 that outputs the terahertz wave T2 and a member (not illustrated) that captures the terahertz wave T3, and it is possible to improve design flexibility regarding arrangement of each member.

Other Modifications

Although some embodiments (first embodiment to fifth embodiment) of the present disclosure have been described above, the present disclosure is not limited to the above embodiments. The material and shape of each component of the laser modules 1A to 1E are not limited to the specific material and shape described above, and various materials and shapes other than those described above may be employed.

In addition, some configurations included in each of the above-described embodiments (first embodiment to fifth embodiment) may be appropriately omitted or changed, and may be arbitrarily combined. Hereinafter, some examples of the arbitrary combinations will be described. For example, in the laser module 1B of the second embodiment, both the lens 8 and the lens 9 (or one of the lens 8 and the lens 9) in the third embodiment may be added. In the laser module 1C of the third embodiment, one of the lens 8 and the lens 9 may be omitted. Also, in the fifth embodiment (FIG. 7), the end surface 3d may be configured as a surface inclined in the same direction as in other embodiments, and the terahertz wave T3 reflected by the first electrode 6 may be directly emitted from the end surface 3d without being reflected by the lower surface 3b.

In the above-described embodiment, the inclination angle θ1 of the end surface 3c and the inclination angle θ2 of the end surface 3d are set to substantially coincide with the Cherenkov angle (the radiation angle $\theta_C$ of the terahertz wave T1). However, the magnitudes of the inclination angles θ1 and 02 are not particularly limited to the above. In addition, when the external resonator is used in the QCL element so that the wavelength of the terahertz wave T1 can be swept (scanned) within a certain range, the radiation angle $\theta_C$ obtained by Equation (1) also changes according to the wavelength of the terahertz wave T1. In this case, the radiation angle $\theta_C$ may be calculated by assuming a terahertz wave T1 of arbitrary wavelength included in the sweepable range. For example, the radiation angle $\theta_C$ may be calculated assuming a terahertz wave T1 of the center wavelength in the sweepable range. The end surfaces 3c and 3d do not necessarily have to be configured as inclined surfaces. That is, at least one of the end surfaces 3c and 3d may be configured as a surface parallel to the direction D2.

What is claimed is:

1. A laser module comprising:
   a quantum cascade laser element configured to generate a first terahertz wave having a difference frequency between a first frequency and a second frequency; and
   a light source configured to emit a second terahertz wave that is different from the first terahertz wave to the quantum cascade laser element, wherein
   the quantum cascade laser element includes:
      a substrate;
      a first clad layer provided on the substrate;

an active layer that is provided on an opposite side of the first clad layer from the substrate, constitutes a resonator that oscillates a light of the first frequency and a light of the second frequency, and generates the first terahertz wave;

a second clad layer provided on an opposite side of the active layer from the first clad layer; and a metal electrode provided on an opposite side of the second clad layer from the active layer, the second terahertz wave enters the active layer through the substrate, is reflected by the metal electrode, and is amplified or wavelength-converted, and a third terahertz wave, which is the second terahertz wave after being amplified or wavelength-converted in the active layer, is emitted to the outside through the substrate.

2. The laser module according to claim 1, wherein the substrate is formed of InP or Si.

3. The laser module according to claim 1, wherein a length of the active layer in a first direction which is a resonance direction of the quantum cascade laser element is 100 μm to 3 mm.

4. The laser module according to claim 1, wherein the substrate is formed of Si, the substrate includes:

a first main surface facing the first clad layer; and a second main surface located on an opposite side of the first main surface, after the second terahertz wave is first reflected by the metal electrode and before the second terahertz wave is emitted to the outside as the third terahertz wave, the second terahertz wave is reflected by the second main surface of the substrate at least once or more and re-enters the active layer.

5. The laser module according to claim 1, wherein the substrate includes:

a first end surface located on a first side in a first direction which is a resonance direction of the quantum cascade laser element; and a second end surface located on a second side opposite to the first side in the first direction, the active layer includes:

a third end surface located on the first side in the first direction; and a fourth end surface located on the second side in the first direction, and the second terahertz wave is incident on the first end surface along a direction inclined with respect to the first direction so as to approach the active layer from the first side toward the second side in the first direction.

6. The laser module according to claim 5, wherein the third terahertz wave is emitted from the second end surface along a direction inclined with respect to the first direction so as to move away from the active layer from the first side toward the second side in the first direction.

7. The laser module according to claim 5, wherein the substrate includes:

a first main surface facing the first clad layer; and a second main surface located on an opposite side of the first main surface, the first end surface is inclined with respect to a second direction orthogonal to the first main surface so as to approach the second end surface from the first main surface toward the second main surface along the second direction.

8. The laser module according to claim 7, wherein an inclination angle of the first end surface with respect to a plane orthogonal to the first direction substantially coincides with an angle at which an emission direction of the first terahertz wave is inclined with respect to the first direction.

9. The laser module according to claim 5, wherein the substrate includes:

a first main surface facing the first clad layer; and a second main surface located on an opposite side of the first main surface, the second end surface is inclined with respect to a second direction orthogonal to the first main surface so as to approach the first end surface from the first main surface toward the second main surface along the second direction.

10. The laser module according to claim 9, wherein an inclination angle of the second end surface with respect to a plane orthogonal to the first direction substantially coincides with an angle at which an emission direction of the first terahertz wave is inclined with respect to the first direction.

11. The laser module according to claim 5, further comprising an incident lens that includes an incident surface on which the second terahertz wave is incident and a facing surface facing the first end surface, wherein the facing surface of the incident lens is in direct or indirect contact with the first end surface.

12. The laser module according to claim 11, wherein the incident lens is formed of Si.

13. The laser module according to claim 11, wherein the incident lens is a meta-lens in which an uneven structure is formed on the incident surface.

14. The laser module according to claim 5, further comprising an exit lens that includes an exit surface that emits the third terahertz wave and a facing surface facing the second end surface, wherein the facing surface of the exit lens is in direct or indirect contact with the second end surface.

15. The laser module according to claim 14, wherein the exit lens is formed of Si.

16. The laser module according to claim 14, wherein the exit lens is a meta-lens in which an uneven structure is formed on the exit surface.

17. The laser module according to claim 7, wherein the first end surface of the substrate protrudes to the first side more than the third end surface of the active layer in the first direction.

18. The laser module according to claim 9, wherein the second end surface of the substrate protrudes to the second side more than the fourth end surface of the active layer in the first direction.

19. The laser module according to claim 1, wherein the substrate includes:

a first end surface located on a first side in a first direction which is a resonance direction of the quantum cascade laser element; and a second end surface located on a second side opposite to the first side in the first direction, the active layer includes:

a third end surface located on the first side in the first direction; and a fourth end surface located on the second side in the first direction, the substrate includes:

a first main surface facing the first clad layer; and a second main surface located on an opposite side of the first main surface, the first end surface is inclined with respect to a second direction orthogonal to the first main surface so as to approach the second end surface from the first main surface toward the second main surface along the second direction, the first end surface of the substrate protrudes to the first side more than the third end surface of the active layer in the first direction, and the second terahertz wave is incident on the first main surface along the second direction, passes through an inside of the substrate, and is reflected by the first end surface and the second main surface to be incident on the active layer.

20. The laser module according to claim 1, wherein the substrate includes:

a first end surface located on a first side in a first direction which is a resonance direction of the quantum cascade laser element; and a second end surface located on a second side opposite to the first side in the first direction, the active layer includes:

a third end surface located on the first side in the first direction; and a fourth end surface located on the second side in the first direction, the substrate includes:

a first main surface facing the first clad layer; and a second main surface located on an opposite side of the first main surface, the first end surface is inclined with respect to a second direction orthogonal to the first main surface so as to approach the second end surface from the second main surface toward the first main surface along the second direction, the first end surface of the substrate protrudes to the first side more than the third end surface of the active layer in the first direction, and the second terahertz wave is incident on the second main surface along the second direction, passes through an inside of the substrate, and is reflected by the first end surface to be incident on the active layer.

\* \* \* \* \*